US011934068B2

United States Patent
Yu

(10) Patent No.: US 11,934,068 B2
(45) Date of Patent: Mar. 19, 2024

(54) DISPLAY MODULE AND MANUFACTURING METHOD THEREOF, AND MOBILE TERMINAL

(71) Applicant: WUHAN CHINA STAR OPTOELECTRONICS TECHNOLOGY CO., LTD., Wuhan (CN)

(72) Inventor: Pengfei Yu, Wuhan (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 233 days.

(21) Appl. No.: 17/437,539

(22) PCT Filed: Jul. 23, 2021

(86) PCT No.: PCT/CN2021/108267
§ 371 (c)(1),
(2) Date: Sep. 9, 2021

(87) PCT Pub. No.: WO2023/279449
PCT Pub. Date: Jan. 12, 2023

(65) Prior Publication Data
US 2023/0213815 A1   Jul. 6, 2023

(30) Foreign Application Priority Data

Jul. 7, 2021   (CN) .......................... 202110765303.2

(51) Int. Cl.
G02F 1/1335      (2006.01)
G02F 1/1345      (2006.01)
(Continued)

(52) U.S. Cl.
CPC ...... *G02F 1/133612* (2021.01); *G02F 1/1345* (2013.01); *H04M 1/0266* (2013.01);
(Continued)

(58) Field of Classification Search
CPC ............ G02F 1/133612; G02F 1/1345; H04M 1/0266; H04M 1/0277; H05K 1/189; H05K 2201/10136
See application file for complete search history.

(56) References Cited

U.S. PATENT DOCUMENTS

2009/0207367 A1   8/2009   Oohira
2021/0068219 A1*  3/2021   Lee ...................... G09G 3/2085

FOREIGN PATENT DOCUMENTS

CN      107155261 A      9/2017
CN      109445649 A      3/2019
(Continued)

*Primary Examiner* — Anne M Hines
*Assistant Examiner* — Jose M Diaz
(74) *Attorney, Agent, or Firm* — The Roy Gross Law Firm, LLC; Roy Gross

(57) ABSTRACT

The present application discloses a display module and a manufacturing method thereof, and a mobile terminal. The display module includes a printed circuit board connected to a backlight flexible circuit board. A side of the backlight flexible circuit board connected to the printed circuit board comprises at least two first bonding regions, wherein each of the first bonding regions includes at least two first bonding terminals distributed therein, and wherein a distance between any two adjacent first bonding regions is greater than a distance between any two adjacent first bonding terminals in each of the first bonding regions.

15 Claims, 4 Drawing Sheets

(51) Int. Cl.
*H04M 1/02* (2006.01)
*H05K 1/18* (2006.01)
(52) U.S. Cl.
CPC .......... *H04M 1/0277* (2013.01); *H05K 1/189* (2013.01); *H05K 2201/10136* (2013.01)

(56) References Cited

FOREIGN PATENT DOCUMENTS

| | | |
|---|---|---|
| CN | 110687729 A | 1/2020 |
| CN | 111208684 A | 5/2020 |
| CN | 112014988 A | 12/2020 |
| CN | 112331093 A | 2/2021 |
| CN | 112631004 A | 4/2021 |

\* cited by examiner

DISPLAY MODULE AND MANUFACTURING METHOD THEREOF, AND MOBILE TERMINAL

CROSS REFERENCE TO RELATED APPLICATIONS

This application is a National Phase of PCT Patent Application No. PCT/CN2021/108267 having International filing date of Jul. 23, 2021, which claims the benefit of priority of Chinese Application No. 202110765303.2 filed Jul. 7, 2021. The contents of the above applications are all incorporated by reference as if fully set forth herein in their entirety.

FIELD OF INVENTION

The present application relates to a field of display technology, in particular to a display module and a manufacturing method thereof, and a mobile terminal with the display module.

BACKGROUND OF INVENTION

A liquid crystal display (LCD) usually includes two parts including a backlight source and a display panel. The backlight source includes an LED backlight source to provide a backlight for the display panel, and a number of LEDs in the LED backlight source will directly affect an overall brightness of the backlight source and uniformity of a light source.

At present, for large and medium-sized displays, the more the number of the LEDs, the better a lighting effect. However, as the number of the LEDs increases, a number of current input signal lines connected to the LEDs also increases. As a result, a number of backlight flexible circuit boards of the backlight source and a number of bonding terminals on corresponding printed circuit boards also increase, resulting in a larger welding region during a pressure welding process, which easily causes poor welding of the bonding terminal positioned in a middle of the welding region.

SUMMARY OF INVENTION

The present application discloses a display module and a manufacturing method thereof, and a mobile terminal, which can reduce a single pressure welding region between a backlight flexible circuit and a printed circuit board, thereby increasing a welding yield rate and improving reliability of the display module.

One embodiment of the present application provides a display module includes:
a backlight assembly;
a printed circuit board disposed on a side of the backlight assembly; and
a backlight flexible circuit board connected between the backlight assembly and the printed circuit board;
wherein a side of the backlight flexible circuit board connected to the printed circuit board includes at least two first bonding regions, wherein each of the first bonding regions includes at least two first bonding terminals distributed therein, and wherein a distance between any two adjacent first bonding regions is greater than a distance between any two adjacent first bonding terminals in each of the first bonding regions.

In one embodiment of the present application, a side of the printed circuit board connected to the backlight flexible circuit board comprises at least two second bonding regions corresponding to the first bonding regions in one-to-one, wherein each of the second bonding regions comprises at least two second bonding terminals distributed therein, and wherein each of the first bonding terminals is connected to one of the second bonding terminals.

In one embodiment of the present application, a side of the backlight flexible circuit board connected to the backlight assembly includes at least two third bonding regions, wherein each of the third bonding regions includes at least two third bonding terminals distributed therein, and wherein a distance between any two adjacent third bonding regions is greater than a distance between any two adjacent third bonding terminals in each of the third bonding region.

In one embodiment of the present application, a side of the backlight assembly connected to the backlight flexible circuit board includes at least two fourth bonding regions corresponding to the third bonding regions in one-to-one, wherein each of the fourth bonding regions includes at least two fourth bonding terminals distributed therein, and wherein each of the third bonding terminals is connected to one of the fourth bonding terminals.

In one embodiment of the present application, a number of the first bonding terminals in each of the first bonding regions are equal.

In one embodiment of the present application, the at least two first bonding regions include a first bonding sub-region and a second bonding sub-region, and wherein a number of the first bonding terminals of the first bonding sub-region is greater than or less than a number of the first bonding terminals of the second bonding sub-region.

According to the above objective of the present application, a method of manufacturing a display module is provided, including:
providing a backlight flexible circuit board, forming at least two first bonding regions spaced apart on a side of the backlight flexible circuit board, and providing at least two first bonding terminals in each of the first bonding regions, wherein a distance between any two adjacent first bonding regions is greater than a distance between any two adjacent first bonding terminals in each of the first bonding region;
providing a printed circuit board; and
bonding the at least two first bonding regions on the backlight flexible circuit board to the printed circuit board sequentially.

In one embodiment of the present application, the step of providing the printed circuit board further includes:
providing at least two second bonding regions spaced apart on one side of the printed circuit board, and providing at least two second bonding terminals in each of the second bonding regions, wherein the at least two second bonding regions are provided in one-to-one correspondence with the at least two first bonding regions.

In one embodiment of the present application, the step of bonding the at least two first bonding regions on the backlight flexible circuit board to the printed circuit board sequentially includes:
providing a solder paste on each of the second bonding terminals;
bonding the at least two first bonding terminals in each of the first bonding regions with the at least two second bonding terminals in the corresponding second bonding regions sequentially by a welding head, wherein each of the first bonding terminals is bound to the corresponding second bonding terminal through the solder paste According to the above-mentioned object of the present application, a mobile terminal includes a display module and a terminal body, wherein the terminal body and the display module are combined into one body, and the display module includes:

a backlight assembly;

a printed circuit board disposed on a side of the backlight assembly; and a backlight flexible circuit board connected between the backlight assembly and the printed circuit board;

wherein a side of the backlight flexible circuit board connected to the printed circuit board comprises at least two first bonding regions, wherein each of the first bonding regions comprises at least two bonding terminals distributed therein, and wherein a distance between any two adjacent first bonding regions is greater than a distance between any two adjacent first bonding terminals in each of the first bonding regions.

In one embodiment of the present application, a side of the printed circuit board connected to the backlight flexible circuit board comprises at least two second bonding regions corresponding to the first bonding regions in one-to-one, wherein each of the second bonding regions comprises at least two second bonding terminals distributed therein, and wherein each of the first bonding terminals is connected to one of the second bonding terminals.

In one embodiment of the present application, a side of the backlight flexible circuit board connected to the backlight assembly comprises at least two third bonding regions, wherein each of the third bonding regions comprise at least two third bonding terminals distributed therein, and wherein a distance between any two adjacent third bonding regions is greater than a distance between any two adjacent third bonding terminals in each of the third bonding region.

In one embodiment of the present application, a side of the backlight assembly connected to the backlight flexible circuit board comprises at least two fourth bonding regions corresponding to the third bonding regions in one-to-one, wherein each of the fourth bonding regions comprises at least two fourth bonding terminals distributed therein, and wherein each of the third bonding terminals is connected to one of the fourth bonding terminals.

In one embodiment of the present application, a number of the first bonding terminals in each of the first bonding regions are equal.

In one embodiment of the present application, the at least two first bonding regions comprise a first bonding sub-region and a second bonding sub-region, and wherein a number of the first bonding terminals of the first bonding sub-region is greater than or less than a number of the first bonding terminals of the second bonding sub-region.

Compared with the prior art, in the present application, the backlight assembly is bound and connected to the printed circuit board through the second backlight flexible circuit board, and the bonding region where the first backlight flexible circuit board connected to the printed circuit board is divided into a plurality of the first bonding region, and first bonding terminals in each first bonding region are press-fitted and bounded to the printed circuit board. In the present application, the bonding region is divided into multiple regions, thereby reducing a press-fitted region during each bonding, which preventing a phenomenon of poor welding between the first bonding terminal in a middle of the welding region and the printed circuit board due to an excessively large single press-fitted region. Furthermore, a yield rate of press-fitting between the first bonding terminal and the printed circuit board is improved, and the reliability of the display module is improved.

DESCRIPTION OF FIGURES

The technical solutions and other beneficial effects of the present application will be made obvious by describing the specific embodiments of the present application in detail below in conjunction with the accompanying figures.

DETAILED DESCRIPTION OF EMBODIMENTS

Figure 1:
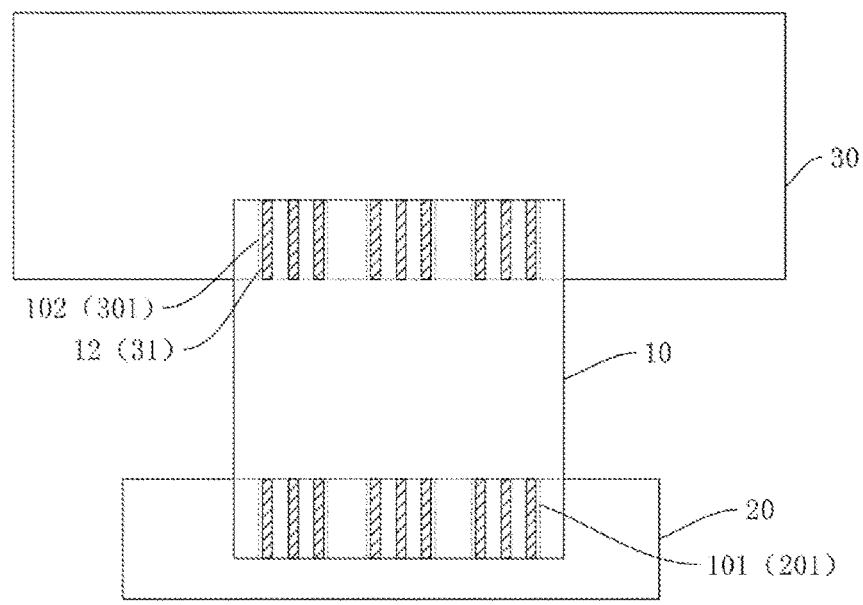
FIG. 1 is an enlarged schematic diagram of a bonding connection structure between a backlight assembly, a backlight flexible circuit board, and a printed circuit board provided by one embodiment of the present application.

The technical solutions in the embodiments of the present application will be clearly and completely described below in conjunction with the figures in the embodiments of the present application. Obviously, the described embodiments are only a part of the embodiments of the present application, rather than all the embodiments. Based on the embodiments in the present application, all other embodiments obtained by those skilled in the art without inventive steps shall fall within a protection scope of the present application.

The following disclosure provides many different embodiments or examples for realizing different structures of the present application. In order to simplify the disclosure of the present application, the components and settings of specific examples are described below. Of course, they are only examples, and are not intended to limit the present application. In addition, the present application may repeat reference numerals and/or reference letters in different embodiments. Such repetition is for a purpose of simplification and clarity, and does not indicate a relationship between the various embodiments and/or settings discussed. In addition, the present application provides examples of various specific processes and materials, but those of ordinary skill in the art may be aware of the present application of other processes and/or the use of other materials.

The embodiment of the present application provides a display module. Please refer to FIG. 1, FIG. 2, and FIG. 3. The display module includes a backlight flexible circuit board 10, a printed circuit board 20, and a backlight assembly 30.

The printed circuit board 20 is disposed on a side of the backlight assembly 30, and the backlight flexible circuit board 10 is connected between the backlight assembly 30 and the printed circuit board 20.

Further, a side of the backlight flexible circuit board 10 connected to the printed circuit board 20 includes at least two first bonding regions 101, wherein each of the first bonding regions 101 includes at least two first bonding terminals 11 distributed in the first bonding regions, and wherein a distance between any two adjacent first bonding regions 101 is greater than a distance between any two adjacent first bonding terminals 11 in each of the first bonding regions 101.

In the implementation and application process, the embodiment of the present application divides the backlight flexible circuit board 10 into the plurality of first bonding regions 101, and correspondingly at least two first bonding terminals 11 are provided in each of first bonding regions 101, and then in a manufacturing process, a welding head can be configured to bond and connect each of first bonding regions 101 to the printed circuit board 20, thereby reducing a welding press-fitted region between the backlight flexible circuit board 10 and the printed circuit board 20 during a single welding, which prevent a phenomenon of poor welding between the first bonding terminal 11 and the printed circuit board 20 in a middle of a welding region due to an excessively large single press-fitted region, thereby improving a yield rate of press-fitting between the first bonding terminal 11 and the printed circuit board 20, and improving reliability of the display module.

Figure 4:
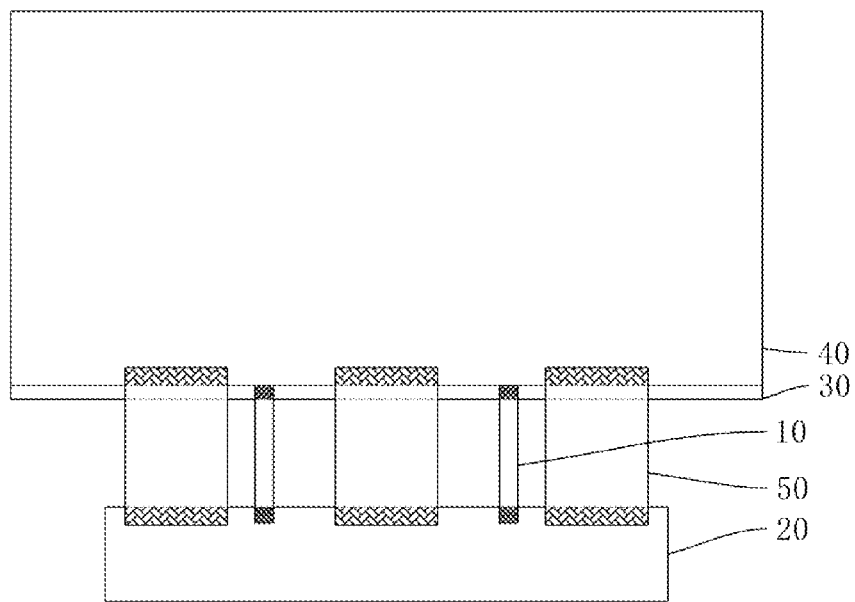
FIG. 4 is a schematic diagram of a bonding connection structure of a display module provided by one embodiment of the present application.
Figure 5:
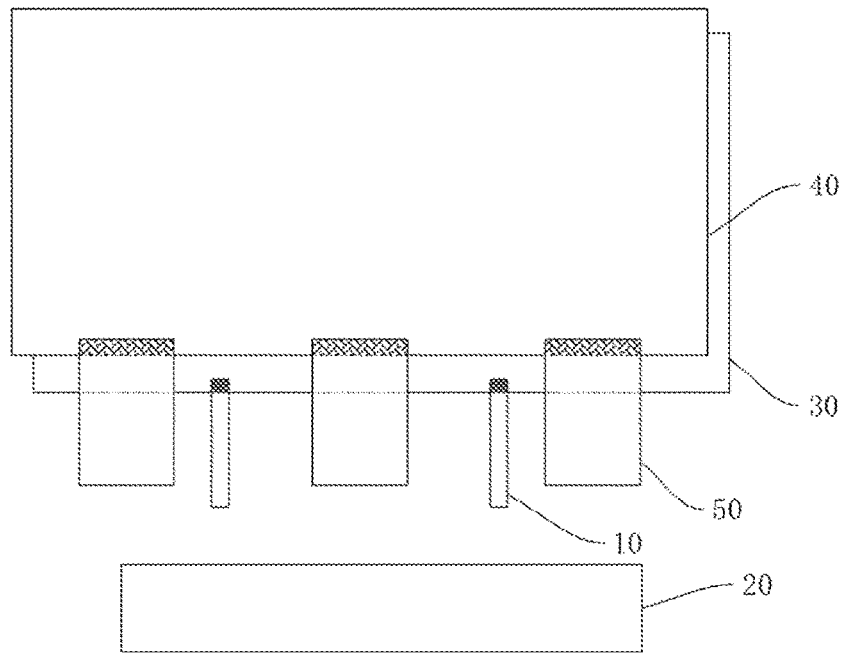
FIG. 5 is an exploded schematic diagram of the bonding connection structure of the display module provided by one embodiment of the present application.
Figure 6:
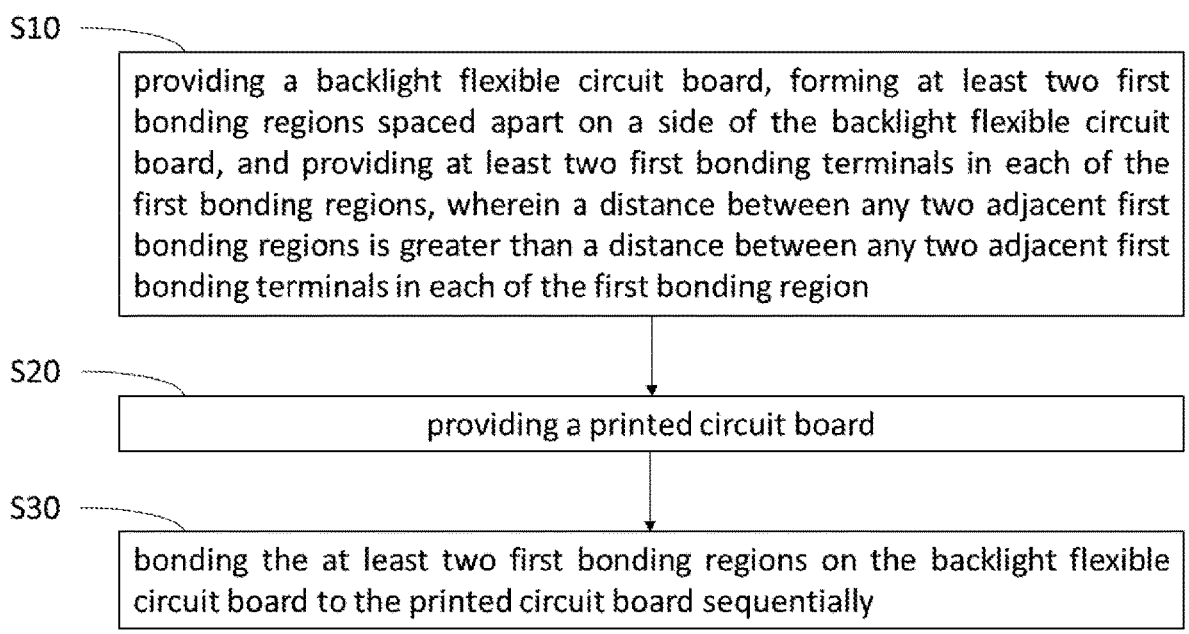
FIG. 6 is a flowchart of a manufacturing method of the display module provided by one embodiment of the present application.

Specifically, referring to FIG. 4 and FIG. 5, the display module provided by the embodiment of the present application includes a display panel 40, a backlight assembly 30, a printed circuit board 20, a backlight flexible circuit board 10, and a display flexible circuit board 50.

The backlight assembly 30 provides a backlight for the display panel 40 for display. Further, the display panel 40 is bonded and connected to the printed circuit board 20 through the display flexible circuit board 50, so as to transmit signals required for the display to the display panel 40 through the display flexible circuit board 50, such as power signals, scan signals, data signals, etc. The backlight assembly 30 is bonded and connected to the printed circuit board 20 through the backlight flexible circuit board 10 so as to transmit signals required by the backlight to the backlight assembly through the backlight flexible circuit board 10, such as power signals, etc.

It should be noted that the display flexible circuit board 50 can be bonded and connected to the display panel 40 and the printed circuit board 20 by using conductive glue, and the backlight flexible circuit board 10 can be welded with the backlight assembly 30 and the printed circuit board 20 by using solder paste to realize signal transmissions.

Figure 2:
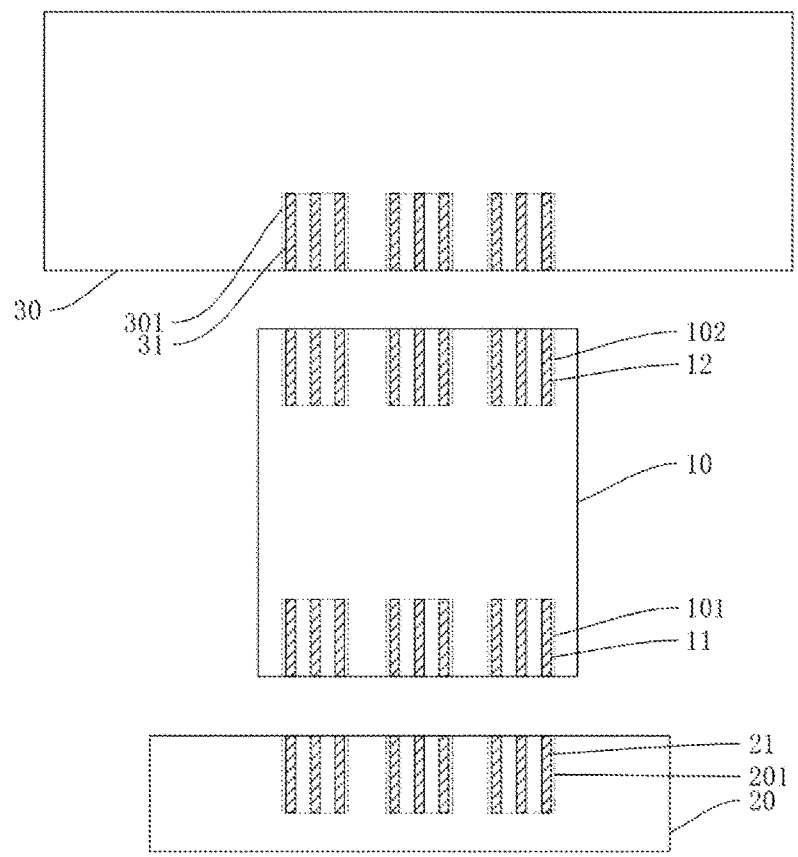
FIG. 2 is an exploded schematic diagram of a connection relationship between the backlight assembly, the backlight flexible circuit board, and the printed circuit board provided by one embodiment of the present application.
Figure 3:
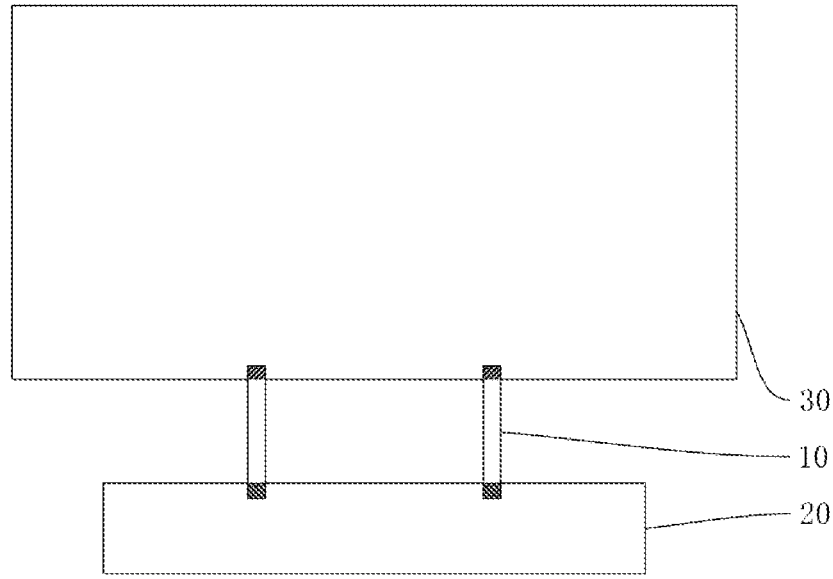
FIG. 3 is a schematic diagram of the bonding connection structure between the backlight assembly, the backlight flexible circuit board, and the printed circuit board provided by one embodiment of the present application.

In the embodiment of the present application, referring to FIGS. 1, 2, and 3, a side of the backlight flexible circuit board 10 connected to the printed circuit board 20 includes at least two first bonding regions 101, wherein each of the first bonding regions 101 includes at least two first bonding terminals 11 distributed in the first bonding regions. A side of the printed circuit board 20 connected to the backlight flexible circuit board 10 includes at least two second bonding regions 201, and each of the second bonding regions 201 includes at least two second bonding terminal 21 distributes in the second bonding regions, wherein the at least two first bonding regions 101 correspond to the at least two second bonding regions 201 in a one-to-one correspondence, and the at least two first bonding terminals 11 in each of the first bonding regions 101 are respectively bonded and connected to its corresponding second bonding terminals 21 of the second bonding regions 201, and wherein each of the first bonding terminals 11 is connected to one of the second bonding terminals 21. That is, the at least two first bonding terminals 11 in each of the first bonding regions 101 and the at least two second bonding terminals 21 of the corresponding is second bonding regions 201 are bounded and connected in the one-to-one correspondence, and the first bonding terminals 11 and the second bonding terminals 21 can be connected by the solder paste.

That is, in the embodiment of the present application, the at least two first bonding regions 101 are defined on the side of the backlight flexible circuit board 10 connected to the printed circuit board 20, and the at least two first bonding terminals 11 are distributed in each of the first bonding regions 101. On the side of the printed circuit board 20 connected to the backlight flexible circuit board 10, at least two second bonding regions 201 are defined in the one-to-one correspondence with the at least two first bonding regions 101, and each of the second bonding regions 201 includes the at least two second bonding terminals 21 distributed in the second bonding regions. Further, the at least two first bonding terminals 11 in each of the first bonding regions 101 are welded to the corresponding second bonding terminals 21 in the second bonding regions 201 by the solder paste, and then during a welding process, a welding head and the solder paste can be configured to perform a press-fitted welding process on the at least two first bonding terminals 11 in each of the first bonding regions 101 to the corresponding second bonding terminal 21 in the second bonding regions 201, thereby reducing a press-fitted region in a single press-fitted welding process, and preventing an uneven press-fitting force between the first bonding terminal 11 and the second bonding terminal 21 positioned in the middle of the welding region due to the excessively large single press-fitting region, which would cause the solder paste not to effectively connect the first bonding terminals 11 and the second bonding terminals 21 and lead to the phenomenon of the poor welding. Thus, a press-fit bonding yield rate of bonding between the first bonding terminals 11 and the second bonding terminals 21 is improved, and the reliability of the display module is improved.

It should be noted that the distance between any two adjacent first bonding regions 101 is greater than the distance between any two adjacent first bonding terminals 11 in each of first bonding regions 101, that is, between any two adjacent first bonding regions 101 forms a heat-insulating region, which can prevent affecting adjacent ones of a single first bonding region 101 and a single second bonding region 201 when the single first bonding region 101 is welded with the single second bonding region 102, thereby improving a yield rate of products.

Optionally, the distance between any two adjacent first bonding regions 101 is greater than or equal to 1 mm.

Please continue to refer to FIGS. 2 and 3. A side of the backlight flexible circuit board 10 connected to the backlight assembly 30 includes at least two third bonding regions 102, and each of the third bonding regions 102 includes at least two third bonding terminals 12 distributed in the third bonding regions. A side of the backlight assembly 30 connected to the backlight flexible circuit board 10 includes at least two fourth bonding regions 301, and each of the fourth bonding regions 301 includes at least two fourth bonding terminals 31, wherein the at least two third bonding regions 102 are arranged in an one-to-one correspondence with the at least two fourth bonding regions 301, and the at least two third bonding terminals 12 in each of third bonding regions 102 are respectively bonded and connected to its corresponding fourth bonding terminals 31 of the fourth bonding regions 301, and wherein each of the third bonding terminals 12 is connected to one of the fourth bonding terminals 301. That is, the at least two third bonding terminals 12 in each of the third bonding regions 102 and the at least two fourth bonding terminals 31 of the corresponding fourth bonding regions 301 are bonded and connected in the one-to-one correspondence, and the third bonding terminals 12 and the fourth bonding terminals 31 can be connected by the solder paste.

That is, in the embodiment of the present application, the at least two third bonding regions 102 are defined on the side of the backlight flexible circuit board 10 connected to the backlight flexible circuit 30, and the at least two third bonding terminals 12 are distributed in each of the third bonding regions 102. On the side of the flexible circuit board 10 connected to the backlight flexible circuit 30, the at least two fourth bonding regions 301 are defined in the one-to-one correspondence with the at least two third bonding regions 102, and each of the fourth bonding regions 301 includes the at least two fourth bonding terminals 31 distributed in the fourth bonding regions. Further, the at least two third bonding terminals 12 in each of the third bonding regions 102 are welded to the corresponding fourth bonding terminals 31 of the fourth bonding regions 301 by the solder paste, and then during the welding process, the welding head and the solder paste can be configured to perform a press-fitted welding process on the at least two third bonding terminals 12 in each of third bonding regions 102 to the corresponding fourth bonding terminals 31 of the fourth bonding regions 301, thereby reducing the press-fitted region in a single press-fitted welding process, and preventing an uneven press-fitting force between the third bonding terminals 12 and the fourth bonding terminals 31 positioned in the middle of the welding region due to the excessively large single press-fitting region, which would cause the solder paste not to effectively connect the third bonding terminals 12 and the fourth bonding terminals 31 and lead to the phenomenon of the poor welding. Thus, a press-fit bonding yield rate of the bonding between the third bonding terminals 12 and the fourth bonding terminals 31 is improved, and the reliability of the display module is improved.

It should be noted that a distance between any two adjacent third bonding regions 102 is greater than a distance between any two adjacent third bonding terminals 12 in each of third bonding regions 102, that is, between any two adjacent third bonding regions 102 forms a heat-insulating region, which can prevent affecting the adjacent ones of the third bonding regions 102 and the fourth bonding regions 301 when the single third bonding regions 102 and the fourth bonding regions 301 are welded, thereby improving the product yield rate.

Optionally, a distance between any two adjacent third bonding regions 102 is greater than or equal to 1 mm.

In one embodiment of the present application, a number of the first bonding terminals 11 in each of the first bonding regions 101 are equal, and correspondingly, a number of the second bonding terminals 21 in each of the second bonding regions 201 are equal.

A number of the third bonding terminals 12 in each of the third bonding regions 102 are equal, and correspondingly, a number of the fourth bonding terminals 31 in each of fourth bonding regions 301 are equal.

In another embodiment of the present application, the at least two first bonding regions 101 include a first bonding sub-region and a second bonding sub-region, wherein a number of the first bonding terminals 11 of the first bonding sub-region is greater than or less than a number of the first bonding terminals 11 of the second bonding sub-region. That is, the number of the first bonding terminals 11 of the first bonding sub-region is not equal to the number of the first bonding terminals 11 of the second bonding sub-region.

When a number of the first bonding regions 101 is greater than 2, the number of the first bonding terminals 11 in each of first bonding regions 101 are not equal, or a number of the first bonding terminals 11 of part of the first bonding regions 101 are not equal, which is not limited here, and can be selected according to actual needs.

In addition, the embodiments of the present application also provide a method of manufacturing the display module described in above embodiments. Please refer to FIG. 2, FIG. 5, FIG. 6, FIG. 7, and FIG. 8. The method of manufacturing the display module includes following steps:

S10: Providing a backlight flexible circuit board 10, forming at least two first bonding regions 101 spaced apart on a side of the backlight flexible circuit board 10, and providing at least two first bonding terminals 11 in each of the first bonding regions 101, wherein a distance between any two adjacent first bonding regions 101 is greater than a distance between any two adjacent first bonding terminals 11 in each of the first bonding regions 101.

Optionally, a distance between any two adjacent first bonding regions 101 is greater than or equal to 1 mm.

S20: Providing a printed circuit board 20.

At least two second bonding regions 201 are provided and spaced apart on one side of the printed circuit board 20, and at least two second bonding terminals 21 are provided in each of the second bonding regions 201, wherein the at least two second bonding regions 201 are disposed in a one-to-one correspondence with the at least two first bonding regions 101.

It should be noted that an order of step S10 and step S20 can be exchanged.

S30: Bonding the at least two first bonding regions 101 on the backlight flexible circuit board 10 to the printed circuit board 20 sequentially.

Specifically, firstly, providing solder paste on each of the second bonding terminals 21.

The at least two first bonding terminals 11 in each of the first bonding regions 101 are bonded with the at least two second bonding terminals 21 in the corresponding second bonding regions 201 sequentially by a welding head 60, wherein each of the first bonding terminals 11 is bound to the corresponding second bonding terminal 21 through the solder paste.

In the embodiment of the present application, the first bonding terminal 11 and the corresponding second bonding terminal 21 are press-fitted and welded together by the welding head with a press-fitted welding process to realize signal transmissions. And in the embodiment of the present application, by reducing a single welding region performed by the welding head, the solder paste can be perfectly and effectively connected between the first binding terminal 11 and the second binding terminal 21 during the press-fitted welding process of the first binding terminals 11 and the second binding terminals 21 to improve the yield rate and the reliability of the display module.

In one embodiment of the present application, a number of the first bonding terminals 11 in each of the first bonding regions 101 are equal, and correspondingly, a number of the second bonding terminals 21 in each of the second bonding regions 201 are equal. A same welding head can be configured to sequentially weld the at least two first bonding regions 101 and the corresponding at least two second bonding regions 201.

Figure 7:
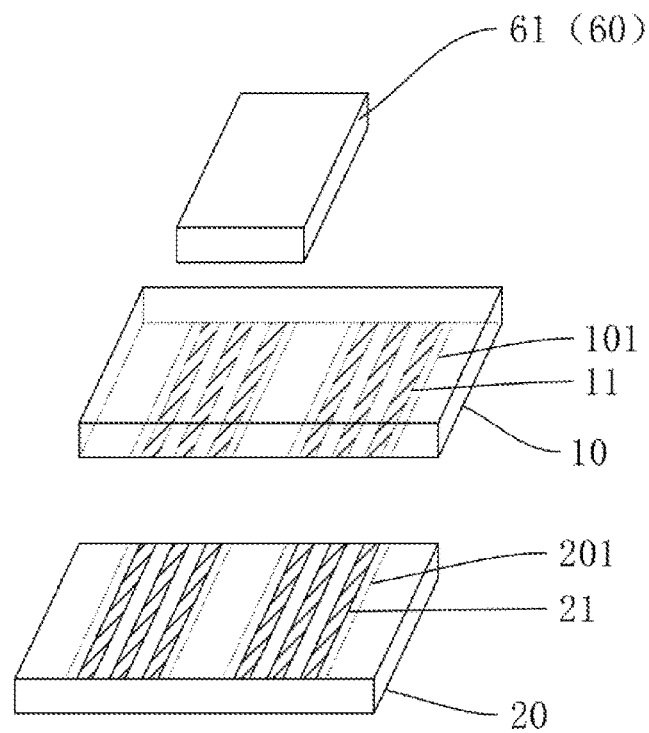
FIG. 7 is a schematic diagram of a welding structure between the backlight flexible circuit board and the printed circuit board provided by one embodiment of the present application.

For example, as shown in FIG. 7, when a number of first bonding terminals 11 in each of first bonding regions 101 are equal, a first welding head 61 can be configured to sequentially weld each of the first bonding regions 101 and a corresponding second bonding region 201 to make each of first bonding terminals 11 is bonded and connected to one corresponding second bonding terminal 21.

Figure 8:
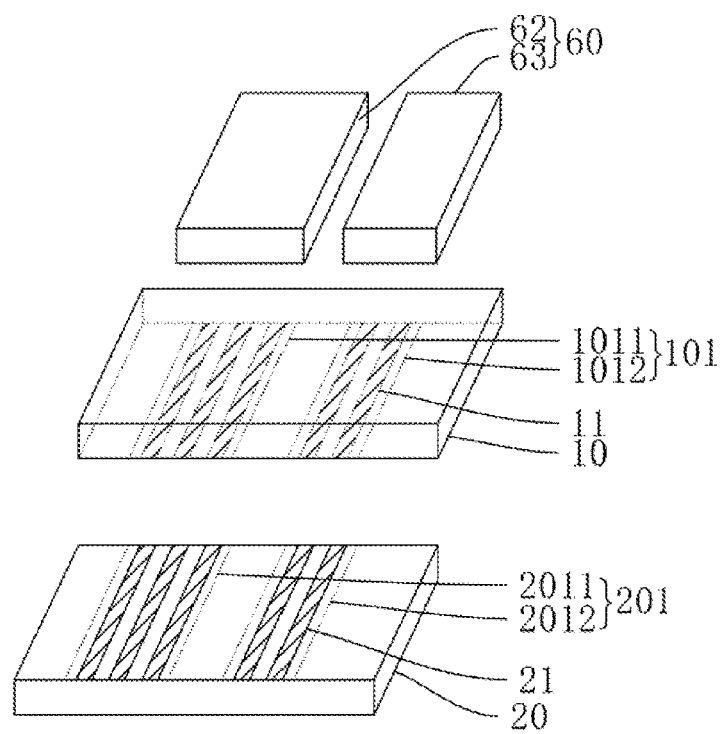
FIG. 8 is a schematic diagram of another welding structure between the backlight flexible circuit board and the printed circuit board provided by one embodiment of the present application.

As shown in FIG. 8, when the at least two first bonding regions 101 include a first bonding sub-region 1011 and a second bonding sub-region 1012, a number of the first bonding terminals 11 of the first bonding sub-region 1011 is not equal to a number of the first bonding terminals 11 of the second bonding sub-region 1012. For example, in the embodiment of the present application, the number of the first bonding terminals 11 of the first bonding sub-region 1011 is greater than that in the second bonding sub-region 1012. Correspondingly, the second bonding region 201 includes a third bonding sub-region 2011 and a fourth bonding sub-region 2012, and a number of the second bonding terminals 21 in the third bonding sub-region 2011 is greater than a number of the second bonding terminals 21 in the fourth bonding sub-region 2012. Further, the number of second bonding terminals 21 in the third bonding sub-region 2011 is equal to the number of first bonding terminals 11 in the first bonding sub-region 1011, and the number of the second bonding terminals 21 in the fourth bonding sub-region 2012 is equal to the number of the first bonding terminals 11 in the second bonding sub-region 1012. A second welding head 62 can be configured to weld the first bonding sub-region 1011 and the third bonding sub-region 2011, and a third welding head 63 can be configured to weld the second bonding sub-region 1012 and the fourth bonding sub-region 2012 so that each of the first bonding terminals 11 is bonded and connected to one corresponding second bonding terminal 21, wherein a welding region of the second welding head 62 is larger than a welding region of the third welding head 63.

In the same way, the method of manufacturing above-mentioned display module provided in the embodiment of the present application only details a bonding and connection process between the flexible circuit board 10 and the printed circuit board 20, in addition, the manufacturing method further includes:

At least two third bonding regions 102 are provided on an other side of the flexible circuit board 10, and at least two third bonding terminals 12 are formed in each of third bonding regions 102, and wherein a distance between any two adjacent third bonding regions 102 is greater than a distance between any two adjacent third bonding terminals 12 in the third bonding regions.

At least two fourth bonding regions 301 are provided in a one-to-one correspondence with the at least two third bonding regions 102 on the other side of the backlight flexible circuit 30. The at least two fourth bonding terminals 31 corresponding to and bonding to the at least two third bonding terminals 12 are provided in each of fourth bonding regions 301.

It should be noted that a structure and a manufacturing process of a bonding connection between the third bonding terminal 12 and the fourth bonding terminal 31 between the flexible circuit board 10 and the backlight assembly 30 can be referred to a bonding connection structure and a manufacturing process between the first bonding terminal 11 and the second bonding terminal 21, and would not be repeated here.

In addition, the manufacturing method of the display module provided by the embodiment of the present application further includes bonding and connecting the display panel 40 and the printed circuit board 20 through the display flexible circuit board 50, and both sides of the display flexible circuit board 50 can be electrically connected to the display panel 40 and the printed circuit board 20 through conductive glue to realize signal transmissions.

In summary, in the embodiment of the present application, the backlight flexible circuit board 10 is divided into at least two first bonding regions 101, and at least two first bonding terminals 11 are provided in each of first bonding regions 101. The circuit board 20 is divided into at least two second bonding regions 201 corresponding to the at least two first bonding regions 101 one-to-one, and at least two second bonding terminals 21 are provided in each of second bonding regions 201, and then in the manufacturing process, the first bonding region 101 and the second bonding region 201 can be bonded and connected in sequence by using the welding head, thereby reducing a welding press-fitting region between the backlight flexible circuit board 10 and the printed circuit board 20 during a single welding, preventing an uneven pressing force between the first bonding terminal 11 and the second bonding terminal 21 in the middle of the welding region due to an excessively large single press-fitting region from making the solder paste unable to effectively connect the first bonding terminal 11 and the second bonding terminal 21 and leading to poor welding. Therefore, the present application increases a yield rate of press-fitting and bonding between the first bonding terminal 11 and the second bonding terminal 21, and improves a reliability of display module.

One embodiment of the present application also provides a mobile terminal. The mobile terminal includes the display module described in the foregoing embodiment and a terminal body, wherein the terminal body and the display module are combined into one body.

The mobile terminal can be a smart phone, a tablet computer, a notebook computer, a digital camera, a digital video camera, a smart wearable device, a car monitor, a TV, or an e-book reader, etc.

In the above-mentioned embodiments, the description of each embodiment has its own emphasis. For parts that are not described in detail in one embodiment, reference may be made to related descriptions of other embodiments.

The above provides a detailed introduction to a display module, a manufacturing method thereof, and a mobile terminal provided by the embodiments of the present application. Specific embodiments are used in the specification to illustrate the principles and implementation of the present application. The description of the above embodiments is only used to help understand the technical solutions of the present application and its core ideas. Those of ordinary skill in the art should understand that they can still modify the technical solutions described in the foregoing embodiments, or equivalently replace some of the technical features. These modification or replacement does not cause an essence of the corresponding technical solutions to deviate from a scope of the technical solutions of the embodiments of the present application.

What is claimed is:

1. A display module, comprising:
a backlight assembly;
a printed circuit board disposed on a side of the backlight assembly; and
a backlight flexible circuit board connected between the backlight assembly and the printed circuit board;
wherein the backlight flexible circuit board is connected to the printed circuit board by welding, a side of the backlight flexible circuit board connected to the printed circuit board comprises at least two first bonding regions, wherein each of the first bonding regions comprises at least two first bonding terminals distributed in each of the first bonding regions, and wherein a distance between any two adjacent first bonding regions is greater than a distance between any two adjacent first bonding terminals in each of the first bonding regions, and a heat-insulating region is formed between any two adjacent first bonding regions.

2. The display module according to claim 1, wherein a side of the printed circuit board connected to the backlight flexible circuit board comprises at least two second bonding regions corresponding to the first bonding regions one-to-one, wherein each of the second bonding regions comprises at least two second bonding terminals distributed in each of the second bonding regions, and wherein each of the first bonding terminals is connected to one of the second bonding terminals.

3. The display module according to claim 1, wherein a side of the backlight flexible circuit board connected to the backlight assembly comprises at least two third bonding regions, wherein each of the third bonding regions comprises at least two third bonding terminals distributed in each of the third bonding regions, and wherein a distance between any two adjacent third bonding regions is greater than a distance between any two adjacent third bonding terminals in each of the third bonding regions.

4. The display module according to claim 3, wherein a side of the backlight assembly connected to the backlight flexible circuit board comprises at least two fourth bonding regions corresponding to the third bonding regions one-to-one, wherein each of the fourth bonding regions comprises at least two fourth bonding terminals distributed in each of the fourth bonding regions, and wherein each of the third bonding terminals is connected to one of the fourth bonding terminals.

5. The display module according to claim 1, wherein a number of the first bonding terminals in each of the first bonding regions are equal.

6. The display module according to claim 1, wherein the at least two first bonding regions comprise a first bonding sub-region and a second bonding sub-region, and wherein a number of the first bonding terminals of the first bonding sub-region is greater than or less than a number of the first bonding terminals of the second bonding sub-region.

7. A method of manufacturing a display module, comprising:
providing a backlight flexible circuit board, forming at least two first bonding regions spaced apart on a side of the backlight flexible circuit board, and providing at least two first bonding terminals in each of the first bonding regions, wherein a distance between any two adjacent first bonding regions is greater than a distance between any two adjacent first bonding terminals in each of the first bonding regions, and a heat-insulating region is formed between any two adjacent first bonding regions;
providing a printed circuit board; and
bonding the at least two first bonding regions on the backlight flexible circuit board to the printed circuit board sequentially by welding.

8. The method of manufacturing the display module according to claim 7, wherein the step of providing the printed circuit board further comprises:
providing at least two second bonding regions spaced apart on one side of the printed circuit board, and providing at least two second bonding terminals in each of the second bonding regions, wherein the at least two second bonding regions are disposed in a one-to-one correspondence with the at least two first bonding regions.

9. The method of manufacturing the display module according to claim 8, wherein the step of bonding the at least two first bonding regions on the backlight flexible circuit board to the printed circuit board sequentially by welding comprises:
providing solder paste on each of the second bonding terminals;
bonding the at least two first bonding terminals in each of the first bonding regions with the at least two second bonding terminals in the corresponding second bonding regions sequentially by a welding head, wherein each of the first bonding terminals is bonded and connected to the corresponding second bonding terminal through the solder paste.

10. A mobile terminal comprising a display module and a terminal body, wherein the terminal body and the display module are combined into one body, and the display module comprises:
a backlight assembly;
a printed circuit board disposed on a side of the backlight assembly; and
a backlight flexible circuit board connected between the backlight assembly and the printed circuit board;
wherein the backlight flexible circuit board is connected to the printed circuit board by welding, a side of the backlight flexible circuit board connected to the printed circuit board comprises at least two first bonding regions, wherein each of the first bonding regions comprises at least two bonding terminals distributed in each of the first bonding regions, and wherein a distance between any two adjacent first bonding regions is greater than a distance between any two adjacent first bonding terminals in each of the first bonding regions, and a heat-insulating region is formed between any two adjacent first bonding regions.

11. The mobile terminal according to claim 10, wherein a side of the printed circuit board connected to the backlight flexible circuit board comprises at least two second bonding regions corresponding to the first bonding regions one-to-one, wherein each of the second bonding regions comprises at least two second bonding terminals distributed in each of the second bonding regions, and wherein each of the first bonding terminals is connected to one of the second bonding terminals.

12. The mobile terminal according to claim 10, wherein a side of the backlight flexible circuit board connected to the backlight assembly comprises at least two third bonding regions, wherein each of the third bonding regions comprise at least two third bonding terminals distributed in each of the third bonding regions, and wherein a distance between any two adjacent third bonding regions is greater than a distance between any two adjacent third bonding terminals in each of the third bonding regions.

13. The mobile terminal according to claim 12, wherein a side of the backlight assembly connected to the backlight flexible circuit board comprises at least two fourth bonding regions corresponding to the third bonding regions one-to-one, wherein each of the fourth bonding regions comprises at least two fourth bonding terminals distributed in each of the fourth bonding regions, and wherein each of the third bonding terminals is connected to one of the fourth bonding terminals.

14. The mobile terminal according to claim 10, wherein a number of the first bonding terminals in each of the first bonding regions are equal.

15. The mobile terminal according to claim 10, wherein the at least two first bonding regions comprise a first bonding sub-region and a second bonding sub-region, and wherein a number of the first bonding terminals of the first bonding sub-region is greater than or less than a number of the first bonding terminals of the second bonding sub-region.

\* \* \* \* \*